United States Patent
Kubota

(10) Patent No.: US 10,281,822 B2
(45) Date of Patent: May 7, 2019

(54) DEVELOPING TREATMENT METHOD, NON-TRANSITORY COMPUTER STORAGE MEDIUM AND DEVELOPING TREATMENT APPARATUS

(71) Applicant: Tokyo Electron Limited, Tokyo (JP)

(72) Inventor: Minoru Kubota, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/256,948

(22) Filed: Sep. 6, 2016

(65) Prior Publication Data

US 2017/0090292 A1   Mar. 30, 2017

(30) Foreign Application Priority Data

Sep. 25, 2015 (JP) .................... 2015-188094

(51) Int. Cl.
  *G03F 7/32* (2006.01)
  *G03F 7/06* (2006.01)
  *H01L 21/67* (2006.01)
  *B05D 1/00* (2006.01)
  *G03F 7/30* (2006.01)

(52) U.S. Cl.
  CPC .............. *G03F 7/32* (2013.01); *B05D 1/002* (2013.01); *B05D 1/005* (2013.01); *G03F 7/063* (2013.01); *G03F 7/3021* (2013.01); *H01L 21/6708* (2013.01); *H01L 21/6715* (2013.01); *H01L 21/67051* (2013.01)

(58) Field of Classification Search
  CPC .......... G03F 7/32; G03F 7/3021; G03F 7/063; H01L 21/67051; H01L 21/6715; H01L 21/6708; B05D 1/002; B05D 1/005

USPC ............. 430/105, 434, 97; 396/564; 355/27; 118/320

See application file for complete search history.

(56) References Cited

U.S. PATENT DOCUMENTS

| 6,256,323 | B1* | 7/2001 | Benayoun | H04L 7/041 370/474 |
|---|---|---|---|---|
| 2011/0096304 | A1* | 4/2011 | Takeguchi | G03F 7/3021 355/27 |
| 2013/0194557 | A1* | 8/2013 | Yamamoto | G03F 7/3021 355/27 |

(Continued)

FOREIGN PATENT DOCUMENTS

| JP | S60-217627 A | 10/1985 |
|---|---|---|
| JP | 2001-319861 A | 11/2001 |

(Continued)

*Primary Examiner* — Amanda C. Walke
(74) *Attorney, Agent, or Firm* — Posz Law Group, PLC

(57) ABSTRACT

A developing treatment method supplies a developing solution onto a substrate to develop a resist film on the substrate with a predetermined pattern exposed thereon. The method supplies pure water to a central portion of the substrate to form a puddle of the pure water, and then moves a nozzle in a radial direction passing through a center of the substrate while supplying a developing solution to the puddle of the pure water from the nozzle with a wetted surface of the nozzle in contact with the puddle of the pure water, to form a puddle of a diluted developing solution on the substrate. The method then rotates the substrate to diffuse the puddle of the diluted developing solution over an entire surface of the substrate; and then supplies a developing solution to the substrate to develop the substrate.

8 Claims, 9 Drawing Sheets

(56) References Cited

U.S. PATENT DOCUMENTS

2016/0154311 A1* 6/2016 Muta ................. G03F 7/3021
       430/434
2017/0205712 A1* 7/2017 Chou ................. H01L 21/6715

FOREIGN PATENT DOCUMENTS

JP           2015-053467 A      3/2015
WO   WO 2006043253 A2 *  4/2006   ........... G03F 7/3021

* cited by examiner

DEVELOPING TREATMENT METHOD, NON-TRANSITORY COMPUTER STORAGE MEDIUM AND DEVELOPING TREATMENT APPARATUS

CROSS REFERENCE TO RELATED APPLICATIONS

This application is based upon and claims the benefit of priority of the prior Japanese Patent Application No. 2015-188094, filed in Japan on Sep. 25, 2015, the entire contents of which are incorporated herein by reference.

BACKGROUND OF THE INVENTION

1. Field of the Invention

The present invention relates to a developing treatment method of performing a developing treatment on a substrate with a resist film formed thereon to form a predetermined pattern on the substrate, a non-transitory computer storage medium, and a developing treatment apparatus.

2. Description of the Related Art

For example, in a photolithography step in a manufacturing process of a semiconductor device, a resist coating treatment of applying a resist solution onto, for example, a semiconductor wafer (hereinafter, referred to as a "wafer") as a substrate to form a resist film, exposure processing of exposing a predetermined pattern on the resist film, a heat treatment of accelerating the chemical reaction in the resist film after exposure (post-exposure baking), and a developing treatment of developing the exposed resist film, are sequentially performed to form a predetermined resist pattern on the wafer.

As the method of the developing treatment among the treatments and processing, a developing treatment method is proposed which includes: a step of horizontally holding a substrate after exposure on a substrate holding unit; a step of supplying a developing solution from a developing solution nozzle to a part of the substrate to form a puddle, a step of rotating the substrate; a step of moving the developing solution nozzle so that a supply position of the developing solution on the rotated substrate moves along a radial direction of the substrate, to spread the puddle to the entire surface of the substrate; and a step, performed in parallel with the step of spreading the puddle to the entire surface of the substrate, of bringing a contact portion moving together with the developing solution nozzle and having a surface facing the substrate smaller than the front surface of the substrate into contact with the puddle (Japanese Patent Application Laid-open No. 2015-53467).

According to the technology disclosed in Japanese Patent Application Laid-open No. 2015-53467, the amount of the developing solution used can be suppressed and the throughput can be increased, but there is room to further improve the in-plane uniformity.

SUMMARY OF THE INVENTION

The present invention has been made in the above points, and its object is to realize in-plane uniformity higher than that in the prior art in the developing treatment of the substrate.

To achieve the above object, in one aspect of the present invention, a developing treatment method of supplying a developing solution onto a substrate to develop a resist film on the substrate with a predetermined pattern exposed thereon, the method includes: a diluted developing solution puddle forming step of supplying pure water to a central portion of the substrate to form a puddle of the pure water, and then moving a nozzle in a radial direction passing through a center of the substrate while supplying a developing solution to the puddle of the pure water from the nozzle with a wetted surface of the nozzle in contact with the puddle of the pure water, to form a puddle of a diluted developing solution on the substrate; a diffusing step of then rotating the substrate to diffuse the puddle of the diluted developing solution over an entire surface of the substrate; and a developing step of then supplying a developing solution to the substrate to develop the substrate.

According to the one aspect of the present invention, pure water is supplied to a central portion of the substrate to form a puddle of the pure water, and then a nozzle is moved in a radial direction passing through a center of the substrate while a developing solution is being supplied to the puddle of the pure water from the nozzle with a wetted surface of the nozzle in contact with the puddle of the pure water to form a puddle of a diluted developing solution on the substrate. Therefore, a reaction product generated by the diluted developing solution is sequentially expelled from the diluted developing solution between the wetted surface of the nozzle and the front surface of the substrate, namely, the surface of the resist film with the movement of the nozzle, and development with a fresh diluted developing solution is accelerated. Then, after the puddle of the diluted developing solution is formed at the central portion of the substrate as described above, the substrate is rotated to diffuse the puddle of the diluted developing solution over the entire surface of the substrate, so that a so-called pre-wet treatment is performed with the diluted developing solution on the entire substrate.

In this regard, in the conventional method of simply supplying the diluted developing solution to the central portion of the substrate, then rotating the substrate to diffuse the diluted developing solution to thereby perform a pre-wet treatment, and then performing a developing treatment, it is difficult to control the line width at the central portion of the substrate. However, according to the present invention, this point can be improved and the in-plane uniformity is increased.

Further, in one aspect of another viewpoint of the present invention, a developing treatment method of supplying a developing solution onto a substrate to develop a resist film on the substrate with a predetermined pattern exposed thereon, the method includes: a diluted developing solution puddle forming step of moving a nozzle in a radial direction passing through a center of the substrate while supplying a diluted developing solution from the nozzle to the substrate and bringing a wetted surface of the nozzle into contact with the diluted developing solution on the substrate, to form a puddle of the diluted developing solution on the substrate; a diffusing step of then rotating the substrate to diffuse the puddle of the diluted developing solution over an entire surface of the substrate; and a developing step of then supplying a developing solution to the substrate to develop the substrate.

As described above, the nozzle may be moved in the radial direction passing through the center of the substrate while supplying the diluted developing solution onto the substrate from the beginning, and bringing the wetted surface of the nozzle into contact with the diluted developing solution on the substrate to form the puddle of the diluted developing solution on the substrate.

According to another viewpoint, one aspect of the present invention is a non-transitory computer readable storage medium storing a program running on a computer of a controller controlling a developing treatment apparatus to execute the above-described developing treatment method.

According to still another viewpoint, one aspect of the present invention is a developing treatment apparatus of supplying a developing solution onto a substrate to develop a resist film on the substrate with a predetermined pattern exposed thereon, the apparatus including: a substrate holding unit that holds a rear surface of the substrate and rotates the held substrate around a vertical axis; a nozzle having a wetted surface and formed with a supply hole that supplies a developing solution to the wetted surface; a moving mechanism that moves the nozzle; a pure water supply nozzle that supplies pure water onto the substrate; another moving mechanism that moves the pure water supply nozzle; and a controller configured to control the moving mechanism to move the nozzle in a radial direction passing through a center of the substrate from an eccentric position of the substrate while maintaining a distance between the wetted surface of the nozzle and a surface of the resist film on a front surface of the substrate at 0.5 mm to 3.0 mm.

According to yet another viewpoint, one aspect of the present invention is a developing treatment apparatus of supplying a developing solution onto a substrate to develop a resist film on the substrate with a predetermined pattern exposed thereon, the apparatus including: a substrate holding unit that holds a rear surface of the substrate and rotates the held substrate around a vertical axis; a nozzle having a wetted surface and capable of supplying at least a diluted developing solution to the wetted surface; a moving mechanism that moves the nozzle; and a controller configured to control the moving mechanism to move the nozzle in a radial direction passing through a center of the substrate from an eccentric position of the substrate while maintaining a distance between the wetted surface of the nozzle and a surface of the resist film on a front surface of the substrate at 0.5 mm to 3.0 mm.

According to the present invention, in-plane uniformity higher than that in the prior art can be realized in the developing treatment of the substrate.

DETAILED DESCRIPTION OF THE INVENTION

Figure 1:
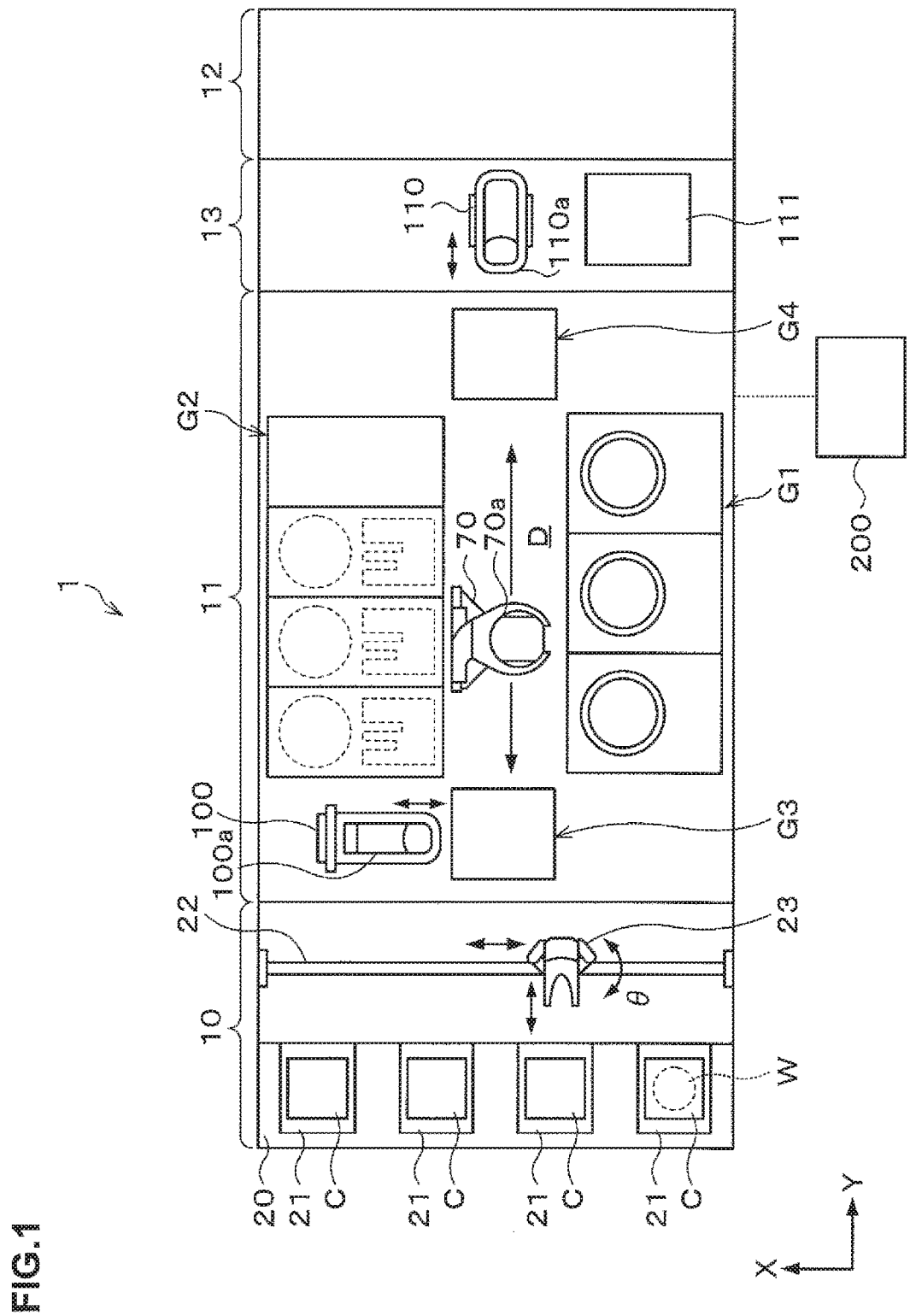
FIG. 1 is a plan view illustrating the outline of a configuration of a substrate treatment system including a developing treatment apparatus that performs a developing treatment method according to an embodiment.
Figure 2:
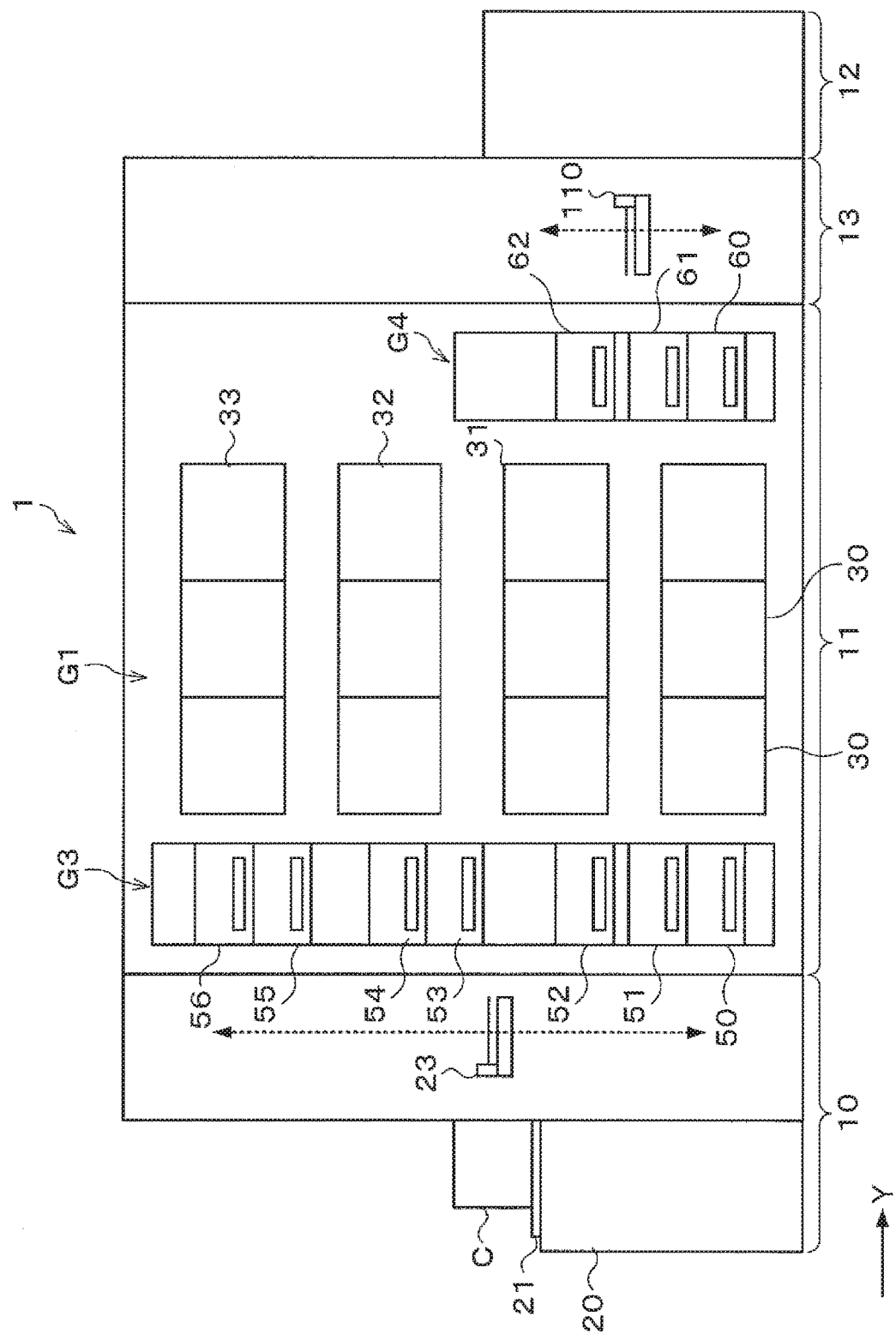
FIG. 2 is a front view schematically illustrating the outline of the configuration of the substrate treatment system in FIG. 1.
Figure 3:
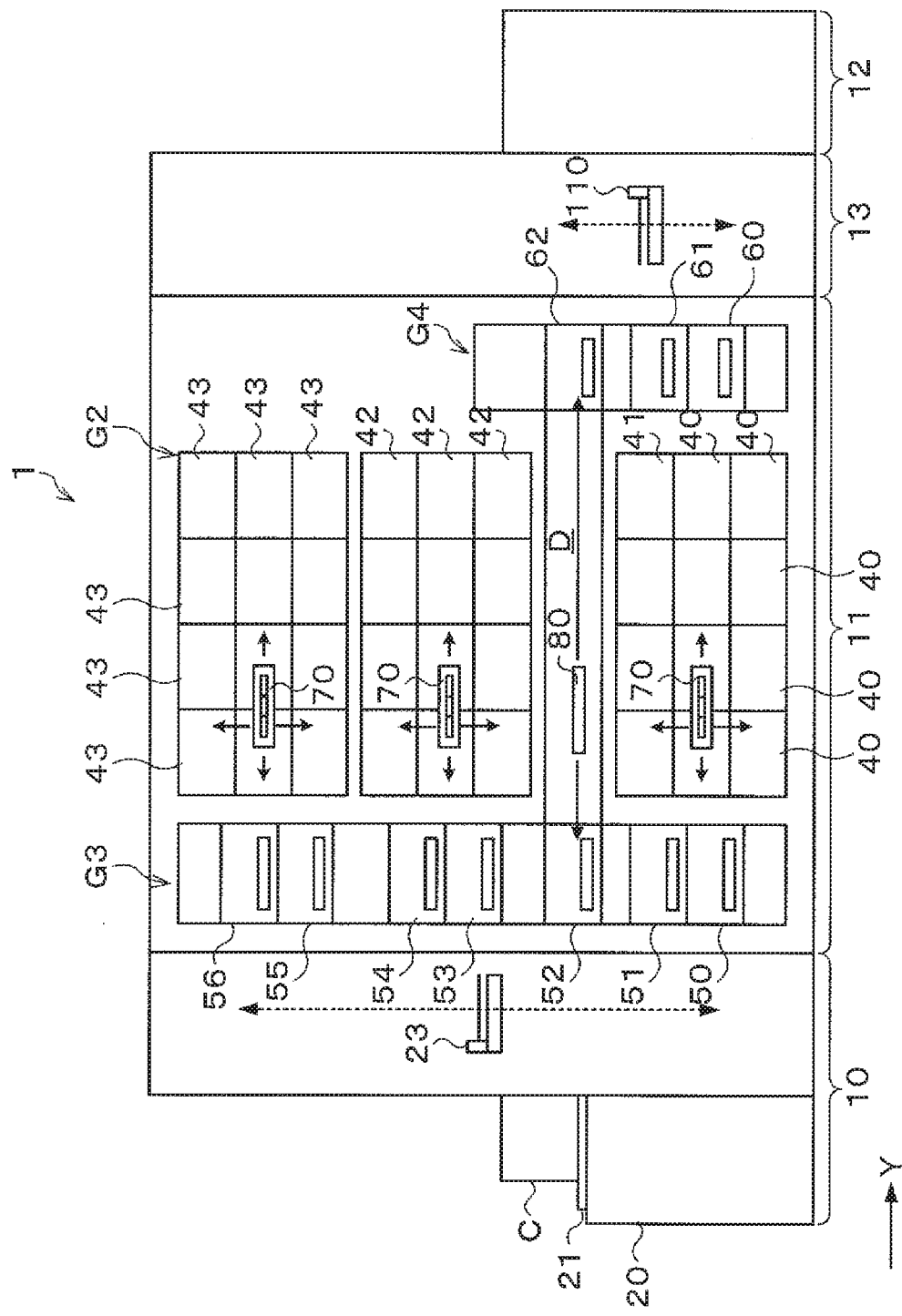
FIG. 3 is a rear view schematically illustrating the outline of the configuration of the substrate treatment system in FIG. 1.

Hereinafter, an embodiment of the present invention will be described. FIG. 1 is a planar explanatory view schematically illustrating the outline of a configuration of a substrate treatment system 1 including a developing treatment apparatus that performs a developing treatment method according to this embodiment. FIG. 2 and FIG. 3 are a front view and a rear view illustrating the outline of an internal configuration of the substrate treatment system 1, respectively.

The substrate treatment system 1 has, as illustrated in FIG. 1, a configuration in which a cassette station 110 into/out of which a cassette C housing a plurality of wafers W is transferred, a treatment station 11 including a plurality of various treatment apparatuses which perform predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction as illustrated in FIG. 1. The wafer transfer apparatus 23 is movable also in a vertical direction and around a vertical axis (in a θ-direction), and can transfer the wafer W between the cassette C on each of the cassette mounting plates 21 and a delivery apparatus in a later-described third block G3 in the treatment station 11.

In the treatment station 11, a plurality of, for example, four blocks, namely, a first block G1 to a fourth block G4 are provided each including various apparatuses. For example, the first block G1 is provided on the front side (X-direction negative direction side in FIG. 1) in the treatment station 11, and the second block G2 is provided on the rear side (X-direction positive direction side in FIG. 1, on the upper side in the drawing) in the treatment station 11. Further, the aforementioned third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which applies a resist solution onto the wafer W to form a resist film, and upper anti-reflection film forming apparatuses 33 each of which forms an anti-reflection film (hereinafter, referred to as an "upper anti-reflection film") at an upper layer of the resist film of the wafer W, are arranged in order from the bottom.

For example, three pieces of each of the developing treatment apparatus 30, the lower anti-reflection film forming apparatus 31, the resist coating apparatus 32, and the upper anti-reflection film forming apparatus 33 are arranged side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In the lower anti-reflection film forming apparatus 31, the resist coating apparatus 32, and the upper anti-reflection film forming apparatus 33, for example, spin coating of applying a predetermined coating solution onto the wafer W is performed. In the spin coating, the coating solution is discharged, for example, from a coating nozzle onto the wafer W and the wafer W is rotated to diffuse the coating solution over the front surface of the wafer W. Note that the configuration of the developing treatment apparatus 30 will be described later.

For example, in the second block G2, a plurality of thermal treatment apparatuses 40 to 43 are provided which perform thermal treatments such as heating and cooling on the wafer W as illustrated in FIG. 3.

For example, in the third block G3, a plurality of delivery apparatuses 50, 51, 52, 53, 54, 55, 56 are provided in order from the bottom as illustrated in FIG. 2 and FIG. 3. Further, in the fourth block G4, a plurality of delivery apparatuses 60, 61, 62 are provided in order from the bottom as illustrated in FIG. 3.

A wafer transfer region D is formed in a region surrounded by the first block G1 to the fourth block G4 as illustrated in FIG. 1. In the wafer transfer region D, for example, a plurality of wafer transfer apparatuses 70 are arranged each of which has a transfer arm 70a that is movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 located therearound.

Further, in the wafer transfer region D, a shuttle transfer apparatus 80 is provided which linearly transfers the wafer W between the third block G3 and the fourth block G4 as illustrated in FIG. 3.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 100 is provided adjacent on the X-direction positive direction side of the third block G3. The wafer transfer apparatus 100 has a transfer arm 100a that is movable, for example, in the X-direction, the θ-direction, and the vertical direction. The wafer transfer apparatus 100 can move up and down while supporting the wafer W by the transfer arm 100a to transfer the wafer W to each of the delivery apparatuses in the third block G3.

In the interface station 13, a wafer transfer apparatus 110 and a delivery apparatus 111 are provided. The wafer transfer apparatus 110 has a transfer arm 110a that is movable, for example, in the Y-direction, the θ-direction, and the vertical direction. The wafer transfer apparatus 110 can transfer the wafer W to/from each of the delivery apparatuses in the fourth block G4, the delivery apparatus 111 and the exposure apparatus 12, for example, while supporting the wafer W by the transfer arm 110a.

Figure 4:
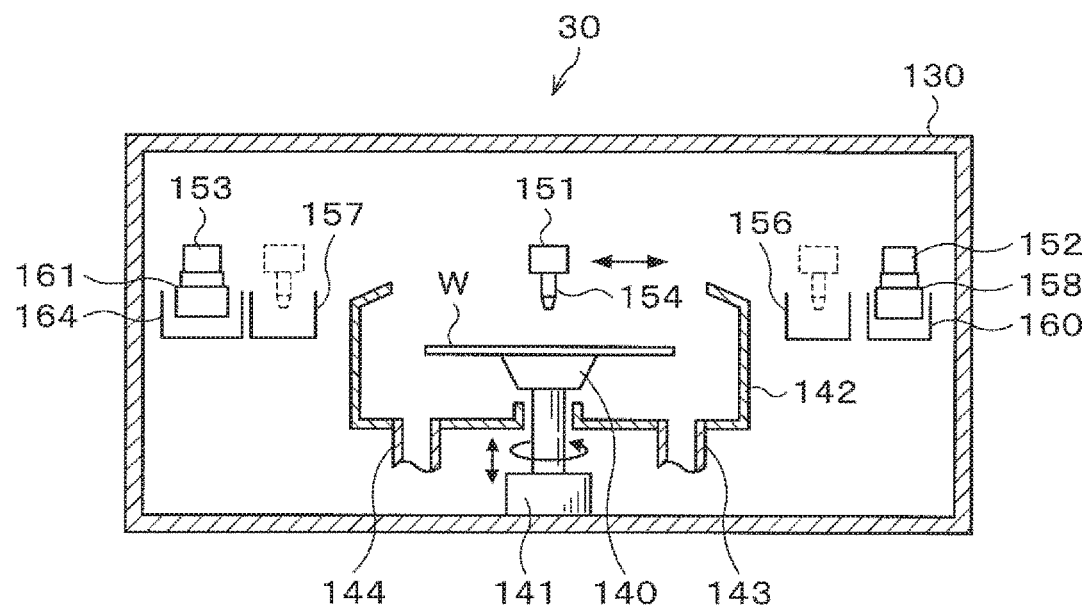
FIG. 4 is a longitudinal sectional view schematically illustrating the outline of a configuration of a developing treatment apparatus.

Next, the configuration of the aforementioned developing treatment apparatus 30 will be described. The developing treatment apparatus 30 has a treatment container 130 whose inside is sealable as illustrated in FIG. 4. In a side surface of the treatment container 130, a transfer-in/out port (not illustrated) for the wafer W is formed.

In the treatment container 130, a spin chuck 140 as a substrate holding unit which holds and rotates the wafer W thereon is provided. The spin chuck 140 can rotate at a predetermined speed by means of a chuck drive unit 141 such as a motor. Further, the chuck drive unit 141 is provided with a raising and lowering drive mechanism such as a cylinder, so that the spin chuck 140 can freely rise and lower.

Around the spin chuck 140, a cup 142 is provided which receives and collects liquid splashing or dropping from the wafer W. A drain pipe 143 that drains the collected liquid and an exhaust pipe 144 that exhausts the atmosphere in the cup 142 are connected to the lower surface of the cup 142.

Figure 5:
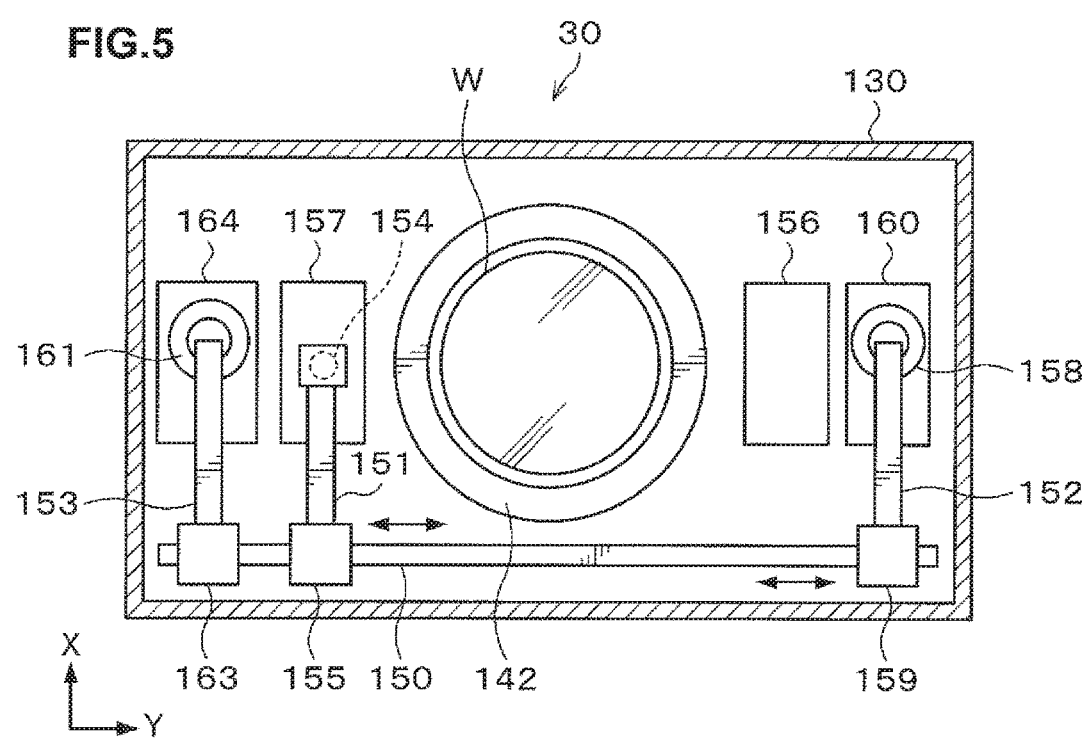
FIG. 5 is a transverse sectional view schematically illustrating the outline of the configuration of the developing treatment apparatus.

As illustrated in FIG. 5, on an X-direction negative direction (lower direction in FIG. 5) side of the cup 142, a rail 150 extending along a Y-direction (right-left direction in FIG. 5) is formed. The rail 150 is formed, for example, from a Y-direction negative direction (left direction in FIG. 5) side outer position of the cup 142 to a Y-direction positive direction (right direction in FIG. 5) side outer position. To the rail 150, for example, three arms 151, 152, 153 are attached.

On the first arm 151, a pure water supply nozzle 154 is supported which supplies pure water. The first arm 151 is movable on the rail 150 by means of a nozzle drive unit 155 illustrated in FIG. 5. Thus, the pure water supply nozzle 154 can move from a waiting section 156 provided at a Y-direction positive direction side outer position of the cup 142 through a position above a central portion of the wafer W in the cup 142 to a waiting section 157 provided at a Y-direction negative direction side outer position of the cup 142.

On the second arm 152, a to-he-diluted developing solution supply nozzle 158 is supported which supplies a to-be-diluted developing solution in a later-described diluted developing solution puddle forming step. The second arm 152 is movable on the rail 150 by means of a nozzle drive unit 159 illustrated in FIG. 5. Thus, the to-be-diluted developing solution supply nozzle 158 can move from a waiting section 160 provided at a Y-direction positive direction side outer position of the cup 142 to a position above a central portion of the wafer W in the cup 142. Further, the second arm 152 can freely rise and lower by means of the nozzle drive unit 159 and thereby adjust the height of the to-be-diluted developing solution supply nozzle 158. The waiting section 160 is provided at a Y-direction positive direction side of the waiting section 156. As the to-be-diluted developing solution, for example, TMAH with a concentration of 2.38 wt % is used.

Figure 6:
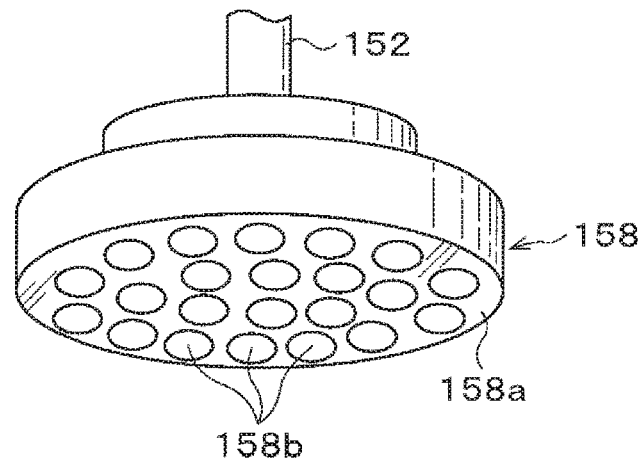
FIG. 6 is a perspective view of a to-be-diluted developing solution supply nozzle.

The to-be-diluted developing solution supply nozzle 158 has, for example as illustrated in FIG. 6, a cylindrical shape as a whole and has a lower end surface 158a formed in a flat face, for example, to be parallel to the wafer W. The lower end surface 158a functions as a wetted surface coming into contact with pure water. However, the lower end surface 158a does not necessarily have to be formed in parallel with the wafer W, but may have, for example, a gentle spherical shape curved convex downward or an inclined surface as long as it can form a liquid film of the developing solution between the lower end surface 158a of the to-be-diluted developing solution supply nozzle 158 and the wafer W.

Further, the lower end surface 158a of the to-be-diluted developing solution supply nozzle 158 is formed with a plurality of supply holes 158b that supply the to-be-diluted developing solution. The number of supply holes 158b can be arbitrarily selected and may be one.

Further, the diameter of the to-be-diluted developing solution supply nozzle 158 is formed to be smaller than the diameter of the wafer W, and the to-be-diluted developing solution supply nozzle 158 with a diameter of 40 mm is used in this embodiment. The to-be-diluted developing solution supply nozzle 158 is made of a material such as PTFE or quartz having chemical resistance. Note that in this embodiment, the diameter of the wafer W is, for example, 300 mm.

On the third arm 153, a developing solution supply nozzle 161 is supported which supplies a developing solution. As the developing solution. supply nozzle 161, the one having the same shape, the same size, and the same structure as those of the above-described to-be-diluted developing solution supply nozzle 158 is employed. As the developing solution, for example, TMAH with a concentration of 2.38 wt % is used.

The third arm 153 is movable on the rail 150 by means of a nozzle drive unit 163 as a moving mechanism illustrated in FIG. 5. Thus, the developing solution supply nozzle 161 can move from a waiting section 164 provided at a Y-direction positive direction side outer position of the cup 142 to a position above a central portion of the wafer W in the cup 142. The waiting section 164 is provided at a Y-direction positive direction side outer position of the waiting section 157. Further, the third arm 153 can freely rise and lower by means of the nozzle drive unit 163 and thereby adjust the height of the developing solution supply nozzle 161.

The configurations of the lower anti-reflection film forming apparatus 31, the resist coating apparatus 32, and the upper anti-reflection film forming apparatus 33 which are the other solution treatment apparatuses are the same as that of the above-described developing treatment apparatus 30 except that the shape and the number of the nozzles, and the solution to be supplied from the nozzles are different, and therefore description thereof is omitted.

In the above substrate treatment system 1, a controller 200 is provided as illustrated in FIG. 1. The controller 200 is, for example, a computer and has a program storage unit (not illustrated). In the program storage unit, a program that controls the treatments on the wafer W in the substrate treatment system 1 is stored. Further, the program storage unit also stores programs that control the operations of the above-described various treatment apparatuses and a driving system such as the transfer apparatuses and the above-described nozzle drive units 155, 159, 163 and the like to realize a later-described developing treatment in the substrate treatment system 1. Note that the programs may be the ones which are recorded, for example, in a computer-readable storage medium such as a computer-readable hard disk (HD), flexible disk (FD), compact disk (CD), magneto-optical disk (MO), or memory card, and installed from the storage medium into the controller 200.

Next, the outline of a wafer treatment performed using the substrate treatment system 1 configured as described above will be described. First, the cassette C housing a plurality of wafers W is transferred into the cassette station 10 of the substrate treatment system 1 and the wafers W in the cassette C are successively transferred by the wafer transfer apparatus 23 to the delivery apparatus 53 in the treatment station 11.

The wafer W is then transferred by the wafer transfer apparatus 70 to the thermal treatment apparatus 40 in the second block G2 and subjected to a temperature regulation treatment. The wafer W is then transferred by the wafer transfer apparatus 70, for example, to the lower anti-reflection film forming apparatus 31 in the first block G1, in which a lower anti-reflection film is formed on the wafer W. The wafer W is then transferred to the thermal treatment apparatus 41 in the second block G2 and subjected to a heat treatment.

The wafer W is then transferred by the wafer transfer apparatus 70 to the thermal treatment apparatus 42 in the second block G2 and subjected to a temperature regulation treatment. The wafer W is then transferred by the wafer transfer apparatus 70 to the resist coating apparatus 32 in the first block G1, in which a resist film is formed on the wafer W. Thereafter, the wafer W is transferred to the thermal treatment apparatus 43 and subjected to a pre-baking treatment.

The wafer W is then transferred to the upper anti-reflection film forming apparatus 33 in the first block G1, in which an upper anti-reflection film is formed on the wafer W. The wafer W is then transferred to the thermal treatment apparatus 43 in the second block G2 and subjected to a heat treatment. The wafer W is then transferred by the wafer transfer apparatus 70 to the delivery apparatus 56 in the third block G3.

The wafer W is then transferred by the wafer transfer apparatus 100 to the delivery apparatus 52 and transferred by the shuttle transfer apparatus 80 to the delivery apparatus 62 in the fourth block G4. Thereafter, the wafer W is transferred by the wafer transfer apparatus 110 in the interface station 13 to the exposure apparatus 12 and subjected to exposure processing in a predetermined pattern.

The wafer W is then transferred by the wafer transfer apparatus 70 to the thermal treatment apparatus 40 and subjected to a post-exposure baking treatment. Thus, a deprotection reaction is carried out with an acid generated at an exposed portion of the resist film. The wafer W is thereafter transferred by the wafer transfer apparatus 70 to the developing treatment apparatus 30 and subjected to a developing treatment. Hereinafter, the developing treatment in the case of developing the resist film will be described.

Figure 7:
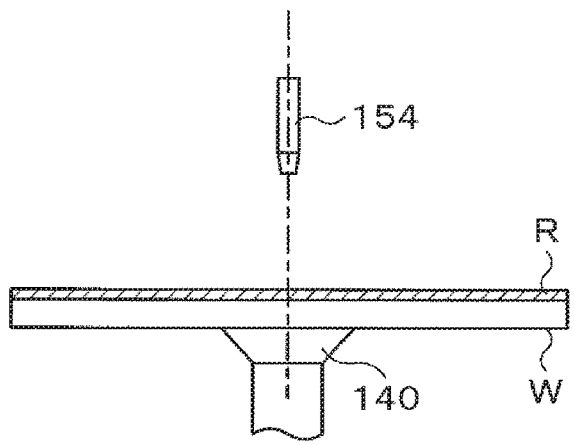
FIG. 7 is an explanatory view from a side face illustrating a state where a pure water supply nozzle is located above a center position on a wafer.
Figure 8:
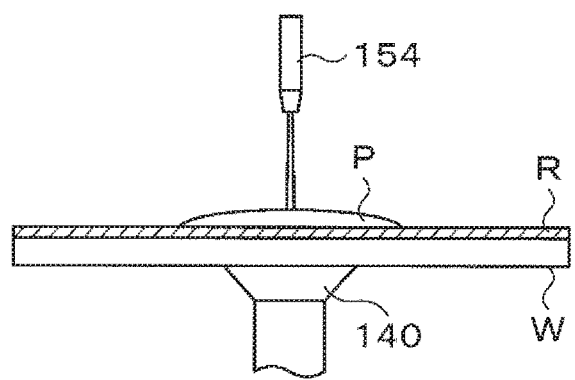
FIG. 8 is an explanatory view from a side face illustrating an appearance where a puddle of pure water is formed on the wafer.

In the developing treatment, first, as illustrated in FIG. 7, the pure water supply nozzle 154 is moved to a position above the center of the wafer W. Then, as illustrated in FIG. 8, a predetermined amount of pure water P is supplied from the pure water supply nozzle 154 to the central portion of the wafer W on which the resist film R has been formed. In this embodiment, for example, 60 to 70 ml of pure water is supplied. In this event, the pure water P is supplied with the wafer W standing still. This forms a puddle of the pure water P at the central portion of the wafer W. In this embodiment, a puddle of the pure water P with a diameter of about 100 mm is formed on the resist film R of the wafer W. Note that in this case, the wafer W does not necessarily have to stand still, but the pure water P may be supplied with the wafer W being rotated as long as the rotation is low-speed rotation at a degree at which the puddle of the pure water P is formed at the central portion of the wafer W.

Figure 9:
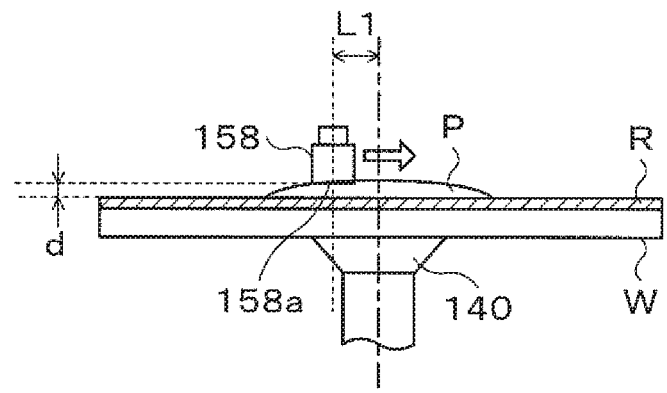
FIG. 9 is an explanatory view from a side face illustrating a state where the to-be-diluted developing solution supply nozzle is located on the puddle of pure water at an eccentric position of the wafer.

Then, the supply of the pure water P is stopped, and the to-be-diluted developing solution supply nozzle 158 is moved to a position eccentric from the center of the wafer W as illustrated in FIG. 9, and supplies a predetermined amount of the to-be-diluted developing solution with the lower end surface 158a in contact with the puddle of the pure water P. In this example, the to-be-diluted developing solution supply nozzle 158 was stopped at a position eccentric from the center of the wafer W by 20 mm, and lowered as it was to bring the lower end surface 158a into contact with the puddle of the pure water P. In other words, the lower end surface 158a was brought into contact with the puddle of the pure water P at a position of a distance L1 from the center of the wafer W to the center of the to-be-diluted developing solution supply nozzle 158 was 20 mm. Further, the nozzle drive unit 159 is controlled by the controller 200 so that a distance d between the lower end surface 158a of the to-be-diluted developing solution supply nozzle 158 and the resist film R at that time is 1 mm.

The to-be-diluted developing solution supply nozzle 158 is horizontally moved as it is in a radial direction by the nozzle drive unit 159 while maintaining the distance d. In this event, the center of the to-be-diluted developing solution supply nozzle 158 moves to pass through the center of the wafer W. The moving speed of the nozzle is, for example, 20 mm/sec. Further, from start of the movement, the to-be-diluted developing solution is supplied from the supply holes 158b of the lower end surface 158a of the to-be-diluted developing solution supply nozzle 158.

In this event, the spin chuck 140 may rotate the wafer W during the movement of the to-be-diluted developing solution supply nozzle 158. The rotation speed of the wafer W in this case is preferably 10 rpm to 400 rpm being low speed rotation.

Figure 10:
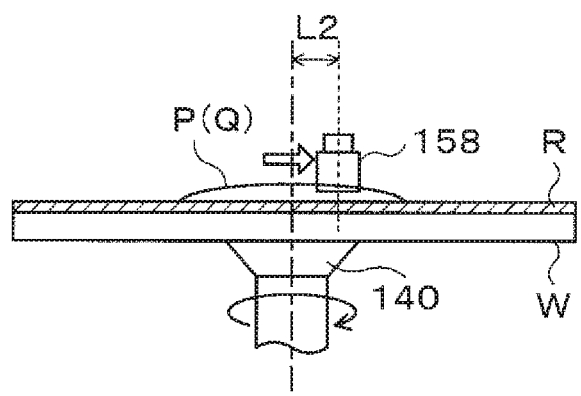
FIG. 10 is an explanatory view from a side face illustrating a state where the to-be-diluted developing solution supply nozzle is moved with its lower end surface in contact with the puddle of pure water.

Then, as illustrated in FIG. 10, the to-be-diluted developing solution supply nozzle 158 is stopped at a position eccentric from the center of the wafer W by 20 mm after passing through the center of the wafer W. In other words, the movement of the nozzle is stopped at a position where a distance L2 from the center of the wafer W to the center of the to-be-diluted developing solution supply nozzle 158 is 20 mm. Further, concurrently with the stop, the supply of the to-be-diluted developing solution is also stopped. Since the moving speed of the nozzle was 20 mm/sec., the to-be-diluted developing solution was resultingly supplied for 2 seconds to the puddle of the pure water P. Thus, 6.7 ml of the to-be-diluted developing solution was supplied to the puddle of the pure water P.

This forms a puddle of a diluted developing solution Q obtained by the dilution at the central portion on the wafer W.

Figure 11:
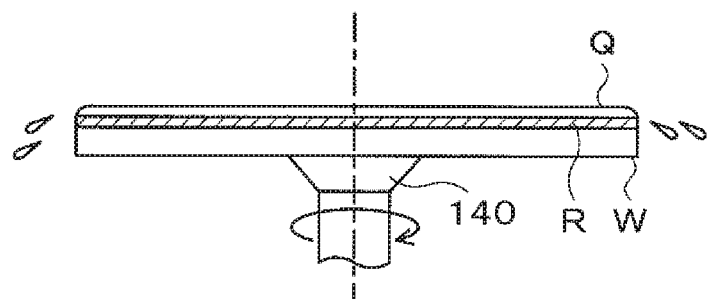
FIG. 11 is an explanatory view from a side face illustrating a state where a diluted developing solution is diffused in an outer peripheral direction of the wafer by rotating the wafer.

Then, the to-be-diluted developing solution supply nozzle 158 is retracted, and the spin chuck 140 rotates the wafer W as illustrated in FIG. 11. The rotation speed is, for example, 200 rpm to 1000 rpm. This diffuses the puddle of the diluted developing solution Q on the wafer W, whereby the front surface of the wafer W is pre-wetted with the diluted developing solution Q.

Figure 12:
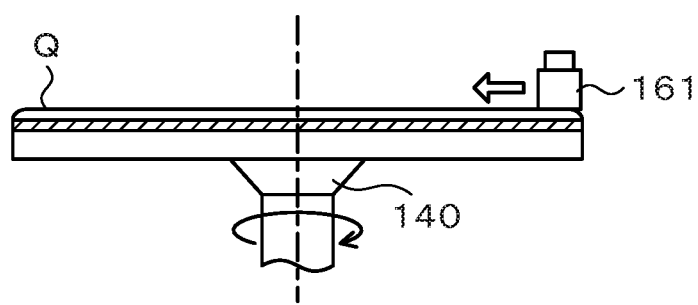
FIG. 12 is an explanatory view from a side face illustrating a state where a developing solution supply nozzle is located above a peripheral portion of the wafer.
Figure 13:
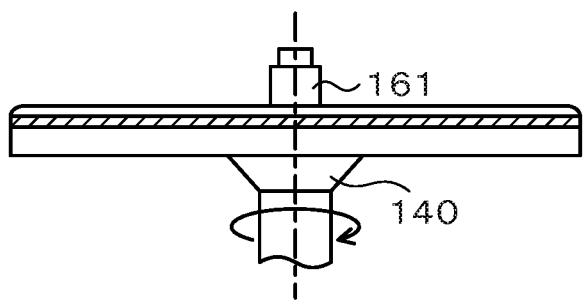
FIG. 13 is an explanatory view from a side face illustrating a state where the developing solution supply nozzle is moved to above a central portion of the wafer.

Then, as illustrated in FIG. 12, the developing solution supply nozzle 161 is moved to a peripheral portion of the wafer W, and the developing solution is supplied from the developing solution supply nozzle 161 onto the wafer W while the wafer W is being rotated by the spin chuck 140, and the developing solution supply nozzle 161 is moved to the center of the wafer W. The rotation speed of the wafer W in this event is, for example, 120 to 130 rpm, and the moving speed of the developing solution supply nozzle 161 is 15 mm/sec. Then, as illustrated in FIG. 13, after the developing solution supply nozzle 161 reaches a position above the center of the wafer W, the movement of the developing solution supply nozzle 161 is stopped, the supply of the developing solution from the developing solution supply nozzle 161 is also stopped, and the rotation of the spin chuck 140 is then stopped. In the supply process of the developing solution, 40 to 42 ml of the developing solution was supplied to the wafer W in this example.

Then, the developing solution supply nozzle 161 is retracted, and stand development is performed for a predetermined time. Thereafter, the pure water supply nozzle 154 is moved again to the position above the center of the wafer W, pure water is supplied to the wafer W while the spin chuck 140 is rotating the wafer W, to thereby clean the wafer W. The rotation speed of the wafer W at this time is, for example, 100 rpm to 1200 rpm, and the rotation speed is preferably changed in this range with time.

Then, when the cleaning of the wafer W with the pure water in the above manner ends, the pure water supply nozzle 154 is retracted, and the wafer W is rotated at high speed, for example, 2000 rpm and thereby subjected to shake-off drying. With this, the developing treatment ends, According to the above-described embodiment, the puddle of the pure water P is first formed at the central portion of the wafer W, and then the to-be-diluted developing solution supply nozzle 158 is moved in the radial direction passing through the center of the wafer W while supplying the to-be-diluted developing solution to the puddle of the pure water with the lower end surface 158a of the to-be-diluted developing solution supply nozzle 158, namely, the wetted surface in contact with the puddle of the pure water, to form the puddle of the diluted developing solution on the resist film R of the wafer W. Therefore, a reaction product of the diluted developing solution between the wetted surface of the to-be-diluted developing solution supply nozzle 158 and the surface of the resist film R is sequentially expelled with the movement of the nozzle, and development with a fresh diluted developing solution is accelerated. This enables the control of the line width at the central portion of the wafer W, which has been conventionally difficult in the developing treatment employing the pre-wet treatment with the diluted developing solution. Accordingly, the in-plane uniformity of the whole wafer W is improved.

Figure 14:
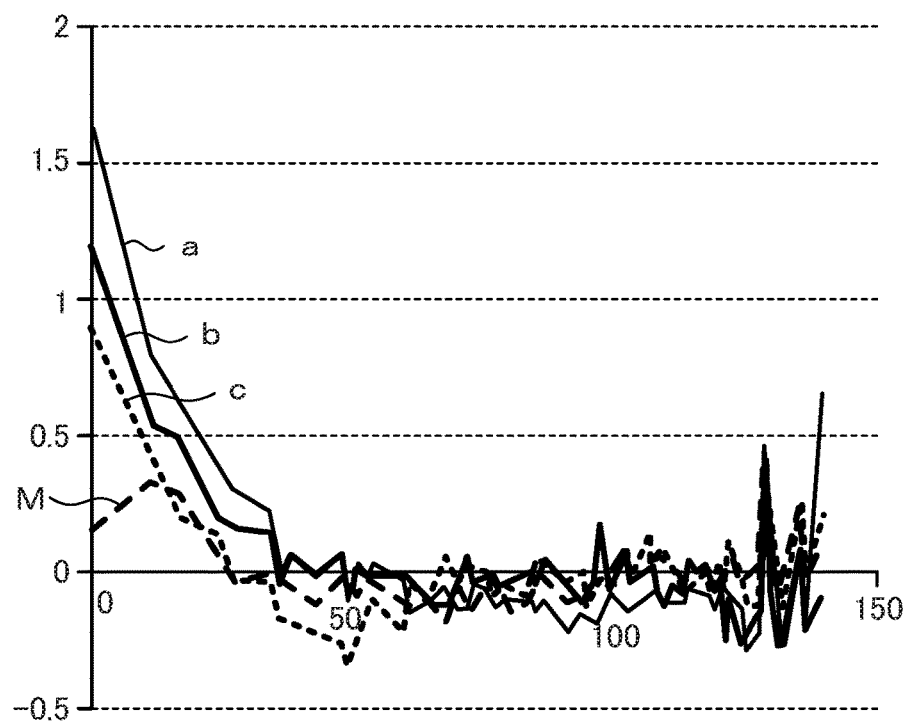
FIG. 14 is a graph illustrating profiles of the line width in the radial direction of the wafer when the embodiment and a simple pre-wet treatment are performed and then developing treatments are performed.

An actually experimented example is illustrated below. FIG. 14 is a graph illustrating profiles of the line width of the pattern in the radial direction of the wafer W when a diluted developing solution diluted with pure water in advance was poured to the entire surface of the wafer W to simply subject the wafer W to a pre-wet treatment (hereinafter, referred to as "simple pre-wet") and then the developing solution was supplied to the wafer W by the same method and conditions as those of the embodiment to perform development. The horizontal axis of the graph indicates the distance (mm) from the center to the edge of the wafer W, and the vertical axis indicates the line width obtained when the line width was measured at 437 points within the wafer W and the measured line widths were standardized. The profiles expressed by lines a, b, c in the graph indicate the case of pre-wetting with diluted developing solutions with developing solution concentrations of 2%, 8%, 15% respectively. A profile expressed by a broken line M indicates a profile when the pre-wet treatment according to this embodiment was performed and then development was performed by the above-described developing treatment.

As is found from the graph in FIG. 14, according to this embodiment, the profile of the line width in a range of 30 mm from the center of the wafer W is greatly improved from that in the simple pre-wet, and the in-plane uniformity is improved as a whole.

The to-be-diluted developing solution is supplied with the lower end surface 158a of the to-be-diluted developing solution supply nozzle 158 in contact with the puddle of the pure water while maintaining the distance d between the lower end surface 158a of the to-be-diluted developing solution supply nozzle 158, namely, the wetted surface and the resist film R on the front surface of wafer W at 1 mm in the above embodiment, but it has been found that a shorter distance d is more preferable.

Figure 15:
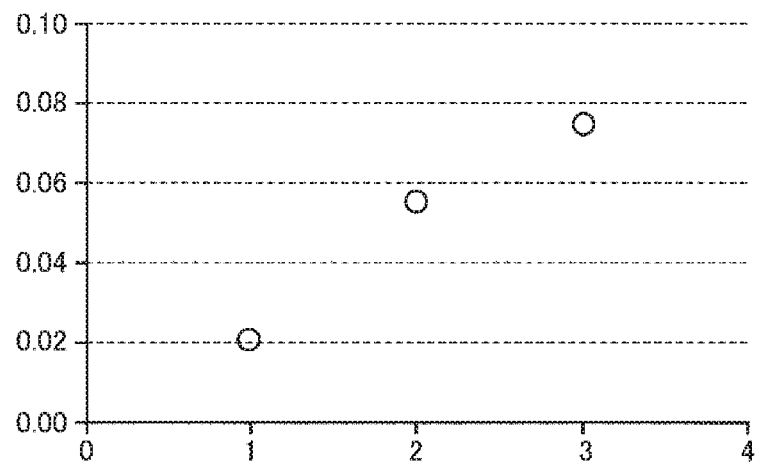
FIG. 15 is a graph illustrating the relationship between the distance between a wetted surface of the to-be-diluted developing solution supply nozzle and a resist film on the wafer, and, the uniformity of the line width.

FIG. 15 is a graph illustrating comparison between the difference in line width (unit nm) in the case of classifying the line width to a line width between the center of the wafer W and 50 mm therefrom and a line width between 51 mm from the center of the wafer W and the edge of the wafer W when the same pre-wet treatment was performed with the distance d between the wetted surface and the resist film R on the front surface of the wafer W set to 3 mm, 2 mm, 1 mm. This shows that when the distance d between the lower end surface 158a of the to-be-diluted developing solution supply nozzle 158, namely, the wetted surface and the resist film R on the front surface of the wafer W is changed from 3 mm to 1 mm, the difference between the line width between the center of the wafer W and 50 mm therefrom and the line width between 51 mm from the center of the wafer W and the edge of the wafer W becomes smaller. However, when the distance d is less than 0.5 min, the surface of the resist film on the wafer W and the lower end surface 158a of the to-be-diluted developing solution supply nozzle 158, namely, the wetted surface may come into contact with each other though depending on the machine accuracy. Accordingly, the lower limit is considered to be actually 0.5 mm, and appropriately 1.0 mm for more safety.

Further, dilution was performed by moving the to-be-diluted developing solution supply nozzle 158 from the position eccentric from the center of the wafer W by 20 mm through the center to the position eccentric to the opposite side by 20 mm and thereby supplying the to-be-diluted developing solution to the puddle of the pure water in the moving process of 40 mm in total in the above embodiment. The investigation of the line width control at the central portion of the wafer W by the nozzle movement start position and the nozzle movement distance brought results illustrated in FIG. 16, FIG. 17.

Figure 16:
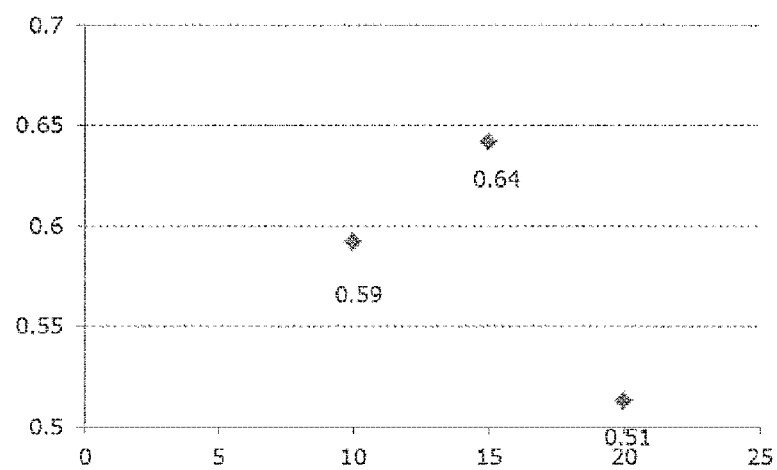
FIG. 16 is a graph illustrating the relationship between the distance of a nozzle movement start position from the center of the wafer and the line width.

FIG. 16 illustrates the relationship between the moving start position of the to-be-diluted developing solution supply nozzle 158 and a 3σ value (vertical axis, unit nm) when the to-be-diluted developing solution is supplied to the puddle of the pure water P with the moving start position (horizontal axis, unit nm) of the to-be-diluted developing solution supply nozzle 158, namely, the distance L1 illustrated in FIG. 9 set to 10 mm, 15 mm, 20 mm from the center of the wafer W. This shows that the in-plane uniformity improves most when the to-be-diluted developing solution supply nozzle 158 is started to move from the position eccentric from the center by 20 mm and supplies the to-be-diluted developing solution as in the embodiment.

Figure 17:
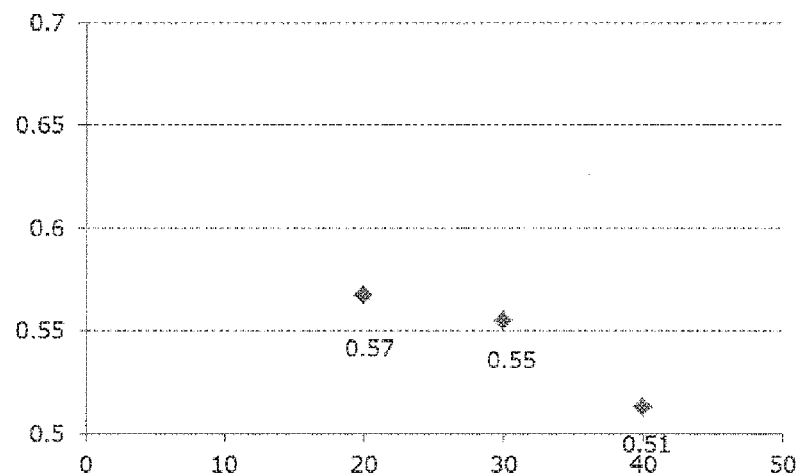
FIG. 17 is a graph illustrating the relationship between the nozzle movement distance and the line width.

Besides, FIG. 17 illustrates the relationship between the moving distance (scan width) of the to-be-diluted developing solution supply nozzle 158 and a 3σ value (vertical axis, unit nm) of the line width when the to-be-diluted developing solution is supplied to the puddle of the pure water with the nozzle movement distance (horizontal axis, unit nm) set to 20 mm, 30 mm, 40 mm. This shows that the in-plane uniformity improves most when the nozzle is moved by 40 mm as in the embodiment.

From the results illustrated in FIG. 16, FIG. 17, adjustment of the distance between the lower end surface 158a of the to-be-diluted developing solution supply nozzle 158, namely, the wetted surface and the resist film R on the wafer W makes it possible to control the line width at the central portion of the wafer W. Further, adjustment of the moving distance of the to-be-diluted developing solution supply nozzle 158 makes it possible to similarly control the line width at the central portion of the wafer W.

Note that the to-be-diluted developing solution supply nozzle 158 and the developing solution supply nozzle 161 having the same shape, the same size, and the same structure are used in the above embodiment, but the dedicated to-be-diluted developing solution supply nozzle 158 is not intentionally prepared but the developing solution supply nozzle 161 may be used to supply the to-be-diluted developing solution to the puddle of the pure water P, and the developing solution supply nozzle 161 may be used to supply the developing solution for development to the wafer W after the pre-wet treatment.

The puddle of the diluted developing solution Q is formed on the wafer W by once supplying the to-be-diluted developing solution from the to-be-diluted developing solution supply nozzle 158 to the puddle of the pure water P in the above embodiment, but a developing solution diluted with pure water in advance may be started to be supplied from the to-be-diluted developing solution supply nozzle 158 at the eccentric position without forming the puddle of the pure water P as described above. Even in such a case, it is necessary, as a matter of course, to supply the diluted developing solution while bringing the lower end surface 158a of the to-be-diluted developing solution supply nozzle 158, namely, the wetted surface into contact with the liquid surface of the supplied diluted developing solution Q and move the nozzle as in the above embodiment.

Even by such a process, a reaction product generated by the diluted developing solution between the lower end surface 158a of the to-be-diluted developing solution supply nozzle 158, namely, the wetted surface and the surface of the resist film R is expelled by the movement of the to-be-diluted developing solution supply nozzle 158, and a fresh diluted developing solution flows therein, so that the profile of the line width at the central portion of the wafer W is improved, and the in-plane uniformity as a whole is improved as in the above embodiment. In addition, the throughput improves more than in the above embodiment.

Note that the to-be-diluted developing solution supply nozzle 158 and the developing solution supply nozzle 161 used in the above embodiment each have a plurality of supply holes in the lower end surface, but the nozzle usable in the present invention is not limited to such a form. For example, the nozzle may have one supply hole.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is also applicable to the case where the substrate is a substrate other than the wafer, such as an FPD (Flat Panel Display), a mask reticle for a photomask or the like.

What is claimed is:

1. A developing treatment method of supplying a developing solution onto a substrate to develop a resist film on the substrate with a predetermined pattern exposed thereon, the method comprising:
    a diluted developing solution puddle forming step of supplying pure water to a central portion of the substrate to form a puddle of the pure water, and then moving a nozzle in a radial direction passing through a center of the substrate while supplying a developing solution to the puddle of the pure water from the nozzle with a wetted surface of the nozzle in contact with the puddle of the pure water, to form a puddle of a diluted developing solution on the central portion of the substrate and expelling, during the formation of the puddle of the diluted developing solution, by the movement of the nozzle, a reaction product generated by the diluted developing solution from between the wetted surface of the nozzle and a surface of the resist film;
    a diffusing step of then rotating the substrate to diffuse the puddle of the diluted developing solution over an entire surface of the substrate; and
    a developing step of then supplying a developing solution to the substrate to develop the substrate,
    wherein a start point of the movement of the nozzle in the diluted developing solution puddle forming step is a start position eccentric from the center of the substrate,
    wherein an end point of the movement of the nozzle in the diluted developing solution puddle forming step is an end position eccentric from the center of the substrate.

2. The developing treatment method according to claim 1, wherein while the nozzle is moved, the substrate is rotated.

3. The developing treatment method according to claim 1, wherein when the nozzle is moved to form the puddle of the diluted developing solution on the substrate, a distance between the wetted surface of the nozzle and the surface of the resist film on a front surface of the substrate is maintained at 0.5 mm to 3.0 mm.

4. The developing treatment method according to claim 1, wherein the supply of the developing solution in the developing step is performed by moving the nozzle from a peripheral portion of the substrate toward the center of the substrate while rotating the substrate.

5. A developing treatment method of supplying a developing solution onto a substrate to develop a resist film on the substrate with a predetermined pattern exposed thereon, the method comprising:
    a diluted developing solution puddle forming step of moving a nozzle in a radial direction passing through a center of the substrate while supplying a diluted developing solution from the nozzle to the substrate and bringing a wetted surface of the nozzle into contact with the diluted developing solution on the substrate, to form a puddle of the diluted developing solution on the central portion the substrate and expelling, during the formation of the puddle of the diluted developing solution, by the movement of the nozzle, a reaction product of the diluted developing solution from between the wetted surface of the nozzle and a surface of the resist film;
    a diffusing step of then rotating the substrate to diffuse the puddle of the diluted developing solution over an entire surface of the substrate; and
    a developing step of then supplying a developing solution to the substrate to develop the substrate,
    wherein a start point of the movement of the nozzle in the diluted developing solution puddle forming step is a start position eccentric from the center of the substrate,
    wherein an end point of the movement of the nozzle in the diluted developing solution puddle forming step is an end position eccentric from the center of the substrate.

6. The developing treatment method according to claim 5, wherein while the nozzle is moved, the substrate is rotated.

7. The developing treatment method according to claim 5, wherein when the nozzle is moved to form the puddle of the diluted developing solution on the substrate, a distance between the wetted surface of the nozzle and the surface of the resist film on a front surface of the substrate is maintained at 0.5 mm to 3.0 mm.

8. The developing treatment method according to claim 5, wherein the supply of the developing solution in the developing step is performed by moving the nozzle from a peripheral portion of the substrate toward the center of the substrate while rotating the substrate.

* * * * *